United States Patent [19]

Emery et al.

[11] Patent Number: 5,164,662

[45] Date of Patent: Nov. 17, 1992

[54] DETECTION OF RADIO FREQUENCY EMISSIONS

[75] Inventors: Franklin T. Emery, Orlando; Paul W. Viscovich, Longwood, both of Fla.

[73] Assignee: Westinghouse Electric Corp., Pittsburgh, Pa.

[21] Appl. No.: 733,530

[22] Filed: Jul. 22, 1991

[51] Int. Cl.$^5$ .................................. G01R 31/02
[52] U.S. Cl. ........................ 324/158 MG; 324/96
[58] Field of Search ............... 324/158 MG, 96; 250/227.2 B

[56] References Cited

U.S. PATENT DOCUMENTS

| | | | |
|---|---|---|---|
| 3,461,384 | 8/1969 | Bayati et al. | 324/96 |
| 3,485,940 | 12/1969 | Perry et al. | 324/96 |
| 3,488,586 | 1/1970 | Watrous et al. | 324/96 |
| 4,431,965 | 2/1984 | Aslan | 324/95 |
| 4,940,933 | 7/1990 | Jenkins | 324/158 MG |

Primary Examiner—Ernest F. Karlsen
Attorney, Agent, or Firm—M. G. Panian

[57] ABSTRACT

A method and system for detecting radio frequency emissions in an electrical machine, by: sensing the radio frequency emissions and deriving a light signal modulated by the radio frequency emissions; conducting the light signal via an optical conductor to a location remote from the site of the emissions; and converting the light signal from the optical conductor into an electrical signal representative of the modulation of the light signal by the emissions.

19 Claims, 1 Drawing Sheet

DETECTION OF RADIO FREQUENCY EMISSIONS

BACKGROUND OF THE INVENTION

The present invention relates to the detection of radio frequency emissions resulting from electrical discharges in a rotating machine.

During the operation of generators and motors, various types of malfunctions are associated with electrical discharges, for example in the stator windings of the machine, which discharges produce radio frequency emissions, as well as light emissions.

Such discharges can occur as a result of insulation deterioration or broken conductors or strands. The resulting electrical discharges include insulation partial discharges, insulation corona, slot discharges and gross arcing. Early detection of such discharges can serve to minimize damage so that the necessary repair can be performed at lower cost and with reduced down time for the machine.

Devices have been proposed for monitoring the light emissions associated with such discharges. In addition, various techniques have been proposed for detecting the radio frequency signals resulting from arcing conditions within large electrical machines. The techniques presently employed for radio frequency arc detection require the positioning of a sensor at the neutral lead of the machine. These devices must be placed at a low voltage location on the machine stator winding and must be connected to recording instruments by wires. The location and paths followed by these wires must be carefully selected.

However, for maximum sensitivity of arc detection, it has been found that placement of a sensor at the high voltage end of the stator winding is required, but existing sensors can not be placed at that location while establishing the necessary electrical high voltage isolation for the recording instrument to which it is attached.

A typical microwave radiation monitor employing electrical connectors between the sensing electrodes and the meter is disclosed in U.S. Pat. No. 4,431,965, which issued to Aslan on Feb. 14, 1984. An arc monitor employing fiber optic cables to detect the light emitted by an arc discharge is disclosed in U.S. Pat. No. 4,940,933, which issued of Jenkins on Jul. 10, 1990.

SUMMARY OF THE INVENTION

It is a primary object of the present invention to facilitate the detection of radio frequency emissions from the interior of rotating electrical machines.

A more specific object of the invention is to sense such radio frequency emissions while maintaining total electrical isolation between the sensor and the associated signal processing and recording instruments.

The above and other objects are achieved, according to the invention by a method and system for detecting radio frequency emissions in an electrical machine, comprising: sensing the radio frequency emissions and deriving a light signal modulated by the radio frequency emissions; conducting the light signal via an optical conductor to a location remote from the site of the emissions; and converting the light signal from the optical conductor into an electrical signal representative of the modulation of the light signal by the emissions.

DESCRIPTION OF THE PREFERRED EMBODIMENTS

Figure 1:
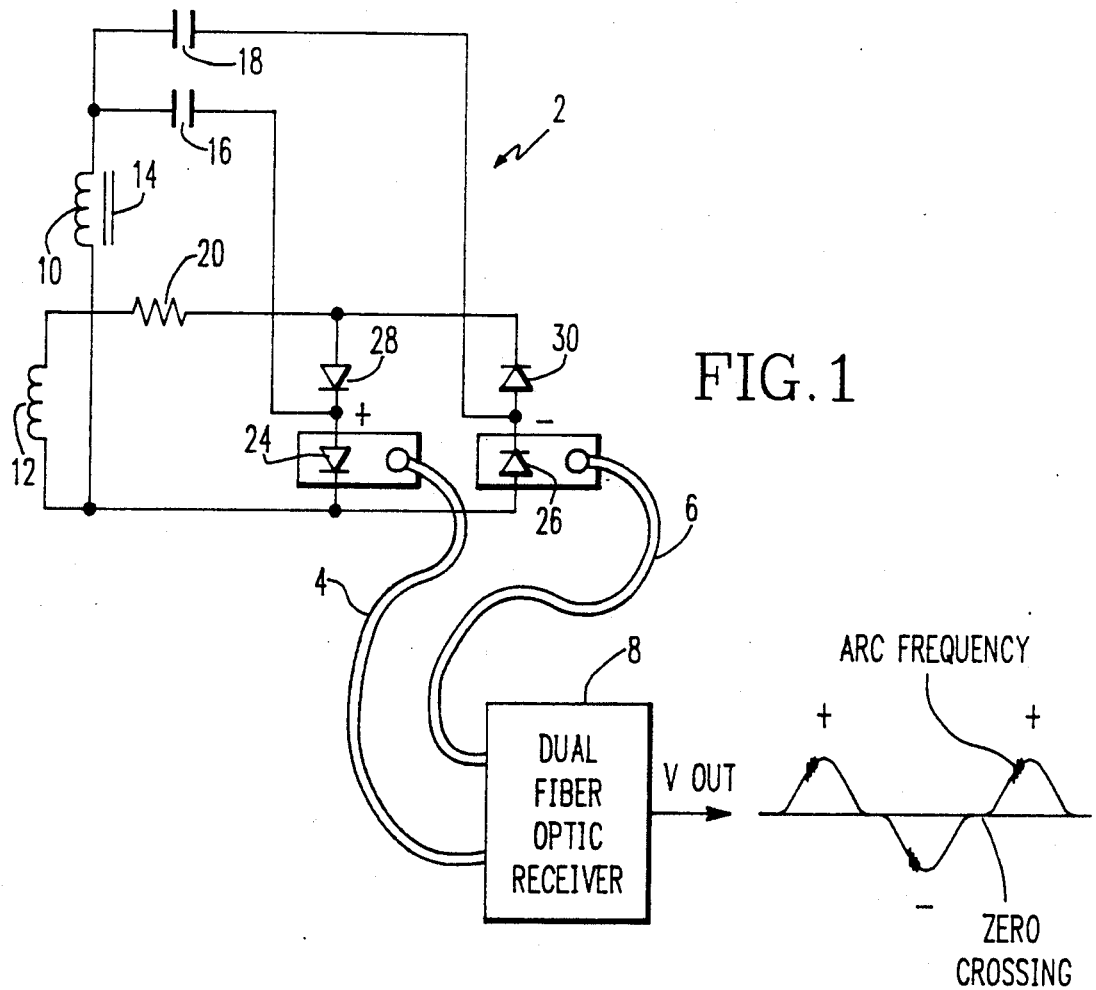
FIG. 1 is a diagram illustrating the components of a sensing system according to a preferred embodiment of the present invention.

The basic components of the system shown in FIG. 1 are a passive radio frequency signal sensor 2, a pair of fiber optic cables 4 and 6, and a receiver 8.

Sensor 2 is capable of sensing radio frequency emissions resulting from either a gross arcing condition or corona developed by partial discharges that occur in groundwall insulation. Sensor 2 is composed essentially of two coils 10 and 12. Coil 10 is associated with a ferrite rod core 14 and coil 10 and rod 14 together constitute a ferrite rod antenna. Coil 10 is connected in series with two capacitors 16 and 18 to form, in effect, two series resonant circuits exhibiting resonant behavior in a frequency range between 1 MHz and 5 MHz, which is the principal frequency range of the emissions to be detected.

Coil 12 is connected in series with a current limiting resistor 20 and has a frequency responses in the range of the 60 Hz, which is the frequency of flux normally existing in such a machine. Sensor 2 will be disposed at a location where such flux exists, so that during normal operation of the machine, a 60 Hz voltage of suitable magnitude will be induced in coil 12.

In an exemplary embodiment of the invention, coil 10 may be composed of 13 turns of #16 wire with a coil length of 1.5 cm. Ferrite rod 14 may have a diameter of 7 millimeters and a length of 5 centimeters. Coil 12 may be composed of 30 turns of #22 wire, with an air core.

Sensor 2 further includes two LEDs 24 and 26, each connecting in series with a respective diode 28, 30 provided to prevent flow of a high level reverse current through the associated LED. Resistor 20 limits the magnitude of the forward current through each LED 24, 26 to a safe value.

LED 24 and diode 28 are connected in a series aiding arrangement, as are LED 26 and diode 30, the two series arrangements being connected in parallel opposition to one another, and both series arrangements are connected across coil 12 so that during each cycle of the voltage induced in coil 12 by the normal 60 Hz stator flux, a current will flow through LED 24 during one half cycle and through LED 26 during the other half cycle, causing each LED to emit light during its associated current conduction half cycle. Thus, one LED 24, 26 or the other will emit light as long as excitation is being applied to the machine.

If radio frequency emissions having frequency components in the response range of the resonant circuits formed by coil 10, rod 14 and capacitors 16 and 18 should occur, these emissions will induce a corresponding output current that will be delivered to LEDs 24 and 26, producing a corresponding variation in the light output from the LED which is currently conducting. While neither LED will emit light during zero amplitude crossings of the normal stator flux, this will not adversely affect the detection result because arcing will not occur when the winding voltage is close to zero.

As will be understood, the 60 Hz voltage applied across each LED 24, 26 produces a bias current which renders the LED light emitting. Then, the current resulting from radio frequency emissions, which will have a relatively low magnitude, is able to vary, or modulate, the LED light output in a detectable manner. Since the light output from each LED 24, 26 contains both a 60 Hz component and components resulting from any radio frequency emissions which occur, the presence of the 60 Hz light signal provides an indication that the sensor is operating properly even if no radio frequency emissions are present.

As noted earlier, coil 10, rod 14 and capacitors 16 and 18 form resonant circuits which exhibit resonant behavior in a defined frequency range. The precise frequency range selected depends on the manner in which the sensor will be employed. For example, if it is intended to detect gross arcs, the resonant frequency band should be centered at 1 MHz, while for detection of corona resulting from partial discharges occurring in groundwall insulation, the resonant frequency response should be centered at about 5 MHz. If sensor 2 is to detect both types of discharge, the resonant circuits should be given a wide bandwidth covering both of the above-mentioned frequency ranges.

The light emitted by LEDs 24, 26, which is directly proportional to the current flow therethrough in the forward direction, is supplied to the input end of a respective one of fiber optic cables 4 and 6, each of which has an output end connected to a respective input of fiber optic receiver 8.

Because the outputs from sensor 2 are conducted as light signals via cables 4 and 6, and sensor 2 is a passive device which derives its operating power by inductive coupling with fields within the machine, no wires need be connected between sensor 2 and any components outside of the machine. Complete electrical isolation is therefore automatically achieved between sensor 2 and receiver 8.

Figure 2:
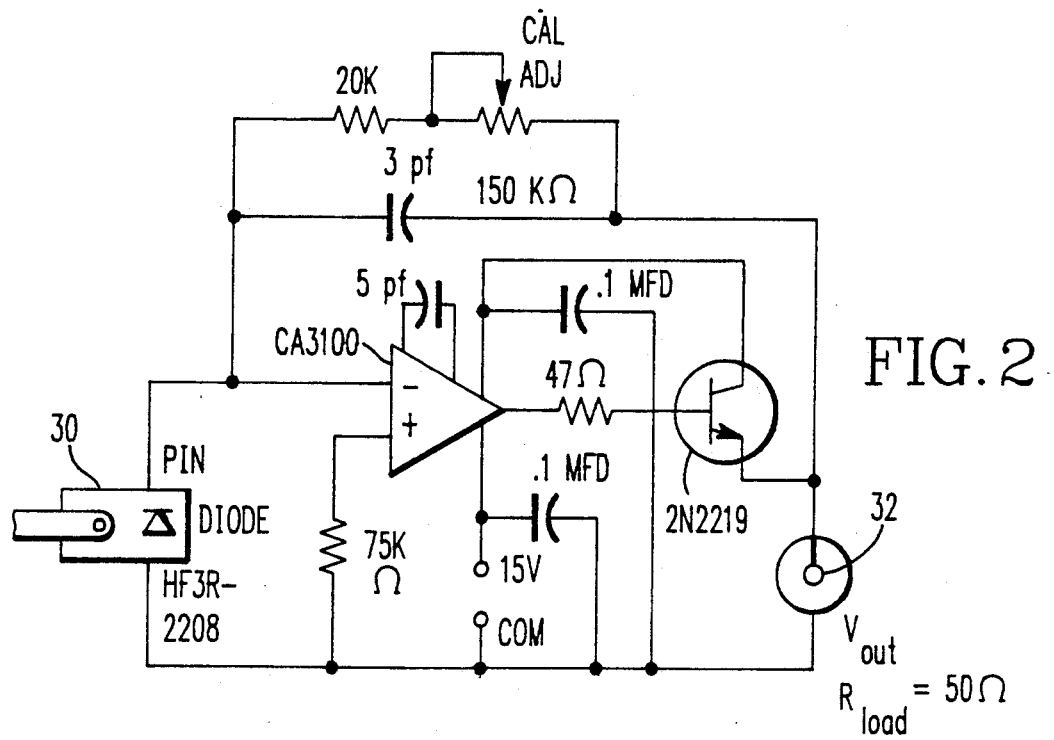
FIG. 2 is a circuit diagram of one preferred embodiment of a receiving circuit employed in the system of FIG. 1.

A suitable embodiment of one channel of receiver 8 is illustrated in FIG. 2. The input element of this channel is a PIN diode 30 which is optically coupled to the output end of a respective cable 4 or 6 to generate an output current proportional to the magnitude of the light signal appearing at the output end of the fiber optic cable. Diode 30 forms the input element a high frequency current amplifier of conventional design. FIG. 2 identifies the component values and device types which may be employed in an exemplary receiver channel. This amplifier develops an output signal, at output connector 32, proportional to the magnitude of light received by diode 30.

In the arrangement shown in FIG. 1, two such channels will form part of receiver 8 and their outputs may be combined, as by a simple summing circuit, to produce the full wave output waveform as depicted in FIG. 1.

Receiver 8 is physically located outside of the electrical machine and may be powered by a conventional DC power supply.

In further accordance with the present invention, a plurality of detecting units may be disposed at various points within a machine to provide output signals which aid in locating the source of arcing. This can be achieved, for example, by comparing the magnitudes of the radio frequency components at the outputs of the amplifiers 8 of the various devices and/or by comparing the time relation between the radio frequency components from one receiver 8 to another.

Embodiments of the present invention can also be constructed with only a single LED, a single fiber optic cable, and a single receiver channel. Such an arrangement will be responsive only to radio frequency emissions occurring during every other half cycle of the normal stator flux, but will provide satisfactory results in situations where it can be assumed that any radio frequency emissions which occur will be present during both half cycles of the stator flux.

In the practice of the present invention, passive sensor 2 can be located at one or more of the following places: in the air gap of a rotating machine; between top and bottom coils; attached directly to a stator coil; or in close proximity to major electrical joints that require monitoring. The most appropriate placement for a single device would appear to be within the air gap between the rotor and stator of the machine. A plurality of devices could be provided, with the sensor 2 of each device being associated with a respective phase of the stator winding. This would make possible increased arc detection sensitivity and direct identification of the phase responsible for arcing. Passive sensor 2 can be assembled to have relatively small dimensions and can be mounted within the machine in any suitable manner.

Typically, each of cables 4 and 6 can have a diameter of the order of 200 microns.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

We claim:

1. A method of detecting radio frequency emissions in an electrical machine, comprising:
    sensing the radio frequency emissions and deriving a light signal modulated by the radio frequency emissions; wherein an alternating electric field having a frequency lower than the frequencies of the emissions is present at the location of the radio frequency emissions which are sensed;
    generating the light signal in response to the alternating electric field; wherein the light signal is powered by generated flux of the alternating field;
    conducting the light signal via an optical conductor to a location remote from the site of the emissions; and
    converting the light signal from the optical conductor into an electrical signal representative of the modulation of the light signal by the emissions.

2. A method as defined in claim 1 wherein an alternating electric field having a frequency lower than the frequencies of the emissions is present at the location of the radio frequency emissions which are sensed in said sensing step, and further comprising generating the light signal in response to the alternating electric field.

3. A method as defined in claim 1 wherein said steps of deriving and generating are performed in a light emitting diode by supplying to the diode a current representative of the emissions and a current representative of the alternating electric field.

4. A method as defined in claim 1 wherein said step of generating is carried out during each half-cycle of the alternating electric field.

5. A method as defined in claim 1 wherein said step of sensing comprises causing the emissions to induce a current in a passive RF sensor tuned to the frequencies of the emissions.

6. A method as defined in claim 1 wherein the machine has a winding which has a low voltage end and a high voltage end, the winding is the source of emissions to be detected, and said step of sensing is performed adjacent the high voltage end of the winding.

7. A system for detecting radio frequency emissions in an electrical machine, comprising:

sensing means disposed for sensing the radio frequency emissions and deriving a light signal modulated by the radio frequency emissions; wherein the machine produces an alternating electric field during normal operation and said sensing means constitute a passive sensor which is powered by the alternating field;

light conducting means including an optical conductor for conducting the light signal to a location remote from the site of the emissions; and converting means connected to said optical conductor for converting the light signal from said optical conductor into an electrical signal representative of the modulation of the light signal by the emissions.

8. A system as defined in claim 7 wherein the machine produces an alternating electric field during normal operation and said sensing means constitute a passive sensor which is powered by the alternating electric field.

9. A system as defined in claim 7 wherein said sensing means comprise a first coil for producing a voltage in response to the alternating electric field and a resonant circuit including a second coil for producing a voltage representative of radio frequency emissions in the machine.

10. A system as defined in claim 9 wherein said sensing means comprise a light-emitting diode connected to said first and second coils for emitting a light signal generated by the voltage produced in said first coil and modulated by the voltage produced in said second coil.

11. A system as defined in claim 10 wherein: said sensing means comprise a protective diode connected in series-aiding with said light-emitting diode; said light-emitting diode and said protective diode are connected across said first coil; and said second coil is connected across said light-emitting diode.

12. A system as defined in claim 11 wherein said sensing means further comprise a capacitor connected in series between said second coil and said light-emitting diode.

13. A system as defined in claim 12 wherein said second coil and said capacitor form a series resonant circuit with a resonant frequency range covering frequencies of the emissions to be detected.

14. A system as defined in claim 13 wherein said sensing means further comprise a ferrite rod forming a core of said second coil.

15. A system as defined in claim 14 wherein said sensing means further comprise a second light-emitting diode connected to said first and second coils in phase opposition to said first-recited light-emitting diode for emitting a second light signal generated by the voltage produced in said first coil and modulated by the voltage produced in said second coil.

16. A system as defined in claim 15 wherein: said sensing means further comprise a second protective diode connected in series-aiding with said second light-emitting diode; said second light-emitting diode and said second protective diode are connected across said first coil; and said second coil is connected across said second light-emitting diode.

17. A system as defined in claim 16 wherein said sensing means further comprise a second capacitor connected in series between said second coil and said second light emitting diode.

18. A system as defined in claim 17 wherein said second coil and said second capacitor form a series resonant circuit with a resonant frequency range covering frequencies of the emissions to be detected.

19. A system as defined in claim 10 wherein said sensing means further comprise a second light-emitting diode connected to said first and second coils in phase opposition to said first-recited light-emitting diode for emitting a second light signal generated by the voltage produced in said first coil and modulated by the voltage produced in said second coil.

* * * * *